United States Patent [19]

Marek

[11] Patent Number: 5,072,175
[45] Date of Patent: Dec. 10, 1991

[54] INTEGRATED CIRCUIT HAVING IMPROVED CONTINUITY TESTABILITY AND A SYSTEM INCORPORATING THE SAME

[75] Inventor: James E. Marek, Cypress, Tex.

[73] Assignee: Compaq Computer Corporation, Houston, Tex.

[21] Appl. No.: 579,839

[22] Filed: Sep. 10, 1990

[51] Int. Cl.⁵ .................... G01R 31/00; G01R 31/02
[52] U.S. Cl. ................. 324/158 R; 324/158 T; 324/537
[58] Field of Search ............ 324/73.1, 158 R, 158 T, 324/537, 538, 133

[56] References Cited

U.S. PATENT DOCUMENTS

| | | | |
|---|---|---|---|
| 3,922,707 | 11/1975 | Freed et al. | 324/158 R |
| 3,956,698 | 5/1976 | Malmberg et al. | 324/158 R |
| 3,969,670 | 7/1976 | Wu | 324/158 R |
| 3,995,215 | 11/1976 | Chu et al. | 324/158 R |
| 4,595,875 | 6/1986 | Chan et al. | 324/537 |
| 4,719,418 | 1/1988 | Flaker et al. | 324/158 R |
| 4,779,041 | 10/1988 | Williamson, Jr. | 324/158 R |
| 4,894,605 | 1/1990 | Ringleb | 324/158 R |
| 4,970,454 | 11/1990 | Stambaugh et al. | 324/158 T |

Primary Examiner—Kenneth A. Wieder
Assistant Examiner—William J. Burns
Attorney, Agent, or Firm—Vinson & Elkins

[57] ABSTRACT

A component, and system including the component, are disclosed which provide for improved continuity testing after board assembly. The component includes an additional diode, connected between a terminal of the component which is connected in parallel to other components and a test terminal. The test terminal is dedicated to the component, and is not connected, during continuity testing, to other lines or to other components. Test of electrical continuity between the component and the circuit board on which it is mounted is made by biasing the line which is intended to be connected to the test terminal, relative to the line which is intended to be connected to the parallel terminal, in such a manner that the additional diode will be forward biased, if continuity is present. Measurement of the impedance (either measurement of the voltage if current is sourced, or measurement of current if voltage is sourced) between the test line and the signal line will indicate continuity or absence thereof. The diode may be biased to a power supplied line during normal operation to provide clamping of signals applied to the component.

14 Claims, 1 Drawing Sheet

INTEGRATED CIRCUIT HAVING IMPROVED CONTINUITY TESTABILITY AND A SYSTEM INCORPORATING THE SAME

This application is in the field of integrated circuits, and is more specifically directed to circuitry therein for improving testing of the circuits after system installation.

BACKGROUND OF THE INVENTION

The placement and connection of packaged integrated circuit components onto circuit boards is, of course, a major manufacturing step in the manufacture of modern computer systems. As more logic and circuit functions are integrated into single components (i.e., integrated circuit "chips"), and as the form factor for such circuit boards becomes smaller and more compact, the step of physical and electrical connection between the circuit boards or other system installation and the component is becoming a more difficult and precise operation.

For example, conventional packages for many very large scale integrated ("VLSI") circuits, especially those performing complex logic functions such as gate arrays and microprocessors, are pin-grid-array type packages having on the order of sixty to one hundred external terminals. The size of these packages is currently on the order of one inch on a side, with the terminal pins being disposed under the package. Leadless packages are also now available which have a similar number and density of terminals, but with low-profile or flush terminals rather than pins, to allow for surface mounting of the components onto circuit boards according to modern techniques. For these modern integrated circuit packages having a large number of terminals in a small area, high precision equipment and techniques are required for proper and reliable connection of all of the terminals onto a circuit board.

Since the placement and connection of such components is a difficult operation, it is of course useful to test the circuit board after assembly of the components thereon to ensure that proper connection has been made to each of the terminals for the circuit. Besides the testing of the continuity of connection between board and component, other functional testing is of course conventionally performed in order to ensure that the completed circuit board functions as specified for the end product.

Continuity testing is conventionally performed at the component level by the manufacturer of the component, and also possibly at an incoming inspection prior to the assembly operation. A conventional technique for such testing is to interrogate parasitic diodes on the integrated circuit chip itself. If the presence of the diode can be detected, the tester concludes that continuity between the test hardware and the chip is present. This continuity testing, for packaged components, thus tests the connection between the component package and the semiconductor integrated circuit chip mounted therewithin. These connections are conventionally made by way of wire bond, solder bumps, and the like.

However, conventional integrated circuit construction, providing such parasitic diodes, does not allow for easy detection of continuity once the packaged component is installed in a system where one or more, and possibly all, of the terminals for each component are connected in parallel with corresponding terminals of other components. This places the parasitic diodes of each component in parallel with those diodes in other components, so that the detection of a diode in a conventional continuity test allows only the conclusion that continuity exists for at least one of the packaged components. However, a lack of continuity at a terminal of one component, connected in parallel with other components, will not be detected so long as continuity exists for any one of the parallel terminals.

As a result, the board manufacturer can only test continuity by the exercising of the functional circuitry for each component, with continuity presumed from successful functional operation of the circuit. This is of course effective for those circuit boards (and components) which pass the test, as the components are tested for both continuity and functionality anyway. However, if a component fails a functional test at the board level, such a failure will not necessarily indicate whether the failure is due to a poor connection (i.e., lack of continuity) to one of the component terminals, due to a failure within the integrated circuit itself, or due to another cause such as a fault with the circuit board or a neighboring component.

This difficulty in determining the cause of failure of a functional test is increased for VLSI logic circuits, which are generally tested by way of stimuli, or vectors, which are determined during the design and simulation of the circuit. Such vectors may not correspond to an operation that the circuit will perform in its intended use, but is designed to fully exercise most, if not all, of the internal nodes and circuits in the shortest amount of time. However, the nature of continuity failures is such that the response of the circuit to such test vector sequences may not be predictable. Accordingly, determination of a continuity failure via analysis of the circuit response to the test vector sequence is either not possible, or alternatively requires significant development expense in simulating such a fault.

In addition, it should be noted that the rework required in the manufacture of a computer system to remedy a component failure of course varies with the failure mechanism. A continuity fault due to a poor connection may generally be reworked merely by reconnecting the packaged component. In contrast, a failure within the integrated circuit itself requires identification of the failing circuit and its replacement on the board. Failures due to marginality of the design of the system require a design change, or tolerance of yield loss due to the marginality. In order to maintain efficient production, the selection of the appropriate rework or corrective action for a failing board should be done with minimal technician troubleshooting. Without the ability to perform an independent component-by-component continuity test, however, such troubleshooting of manufactured circuit boards and computer systems becomes quite complex and time-consuming.

It is therefore an object of this invention to provide an integrated circuit which allows for individual continuity testing after installation in parallel with other packaged integrated circuits on a board or in a system.

It is a further object of this invention to provide a system, and method of testing the same, which allows for individual continuity testing of each component installed in the system.

It is a further object of this invention to provide such a system and method which provides for improved troubleshooting of manufactured boards and systems during their manufacture.

DETAILED DESCRIPTION OF THE PREFERRED EMBODIMENT

Figure 1:
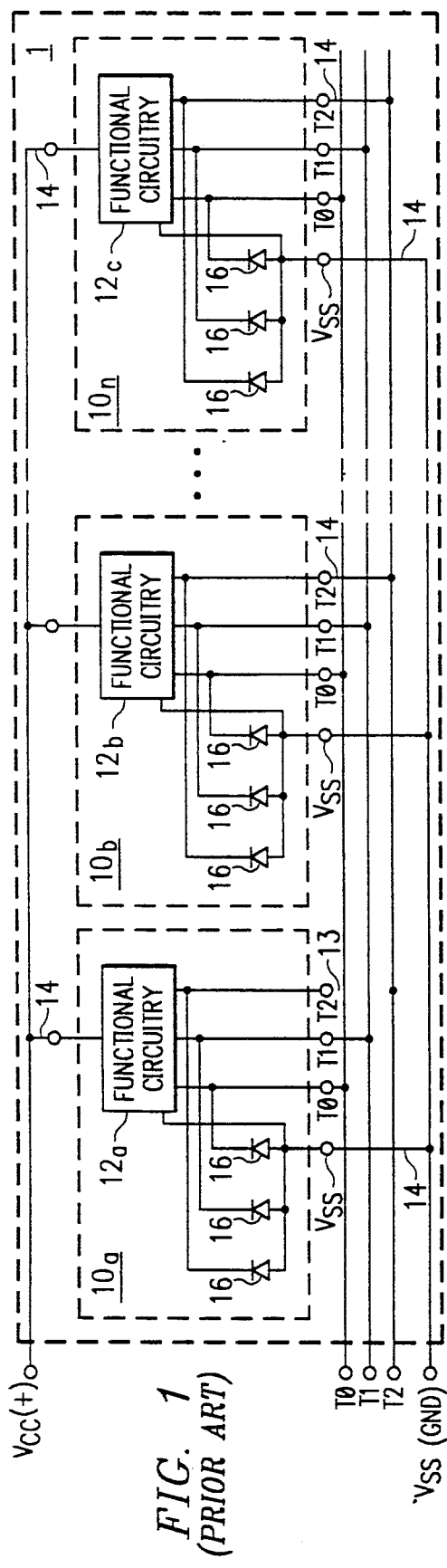
FIG. 1 is an electrical diagram, in schematic form, of a circuit board according to the prior art.

Referring now to FIG. 1, a circuit board 1 constructed according to the prior art will be described in detail. Circuit board 1 may be any one of conventional circuit board types in the art, for example a multilayer printed circuit board having plated-through holes for receiving pin terminals of packaged integrated circuits of the types known as dual-inline-packages (DIPs), single-inline-packages (SIPs), pin-grid-arrays, or the like. Alternatively, circuit board 1 may include vias from underlying interconnection layers which connect, via surface pads, to terminals of surface mountable integrated circuit component packages such as leadless chip-carriers and the like. On circuit board 1 of FIG. 1, integrated circuit components 10a, 10b, and 10n, of a package type consistent with the construction of circuit board 1 as noted hereinabove, are illustrated schematically as located thereon and electrically interconnected. Alternatively, components 10a, 10b, and 10n may be unpackaged semiconductor or other integrated circuits in chip form, which are bonded directly to circuit board 1, for example by way of solder bumps.

It should be noted that while only three components 10 are illustrated in FIG. 1 for clarity, it is of course contemplated that many more components 10 will generally be included on circuit board 1 (as suggested in FIG. 1), some of which may be connected in parallel with one or more of the terminals of components 10a through 10n. Furthermore, it should be noted that passive components such as capacitors and resistors, and other components including transformers, crystal oscillators, and the like may also be included on circuit board 1, as necessary for its functionality.

Each of components 10a through 10n of FIG. 1 includes functional circuitry 12a through 12n, respectively, as shown in FIG. 1. Functional circuitry 12 may consist of such functional circuitry as is conventional in the art for performing the function of each of components 10a through 10n. Examples of such functional circuitry includes microprocessors, gate array circuits, and other logic functions as are readily available either in off-the-shelf components or as custom integrated circuits. Functional circuitry 12 may alternatively include or consist of memory functions, such as in a random access memory or a read-only memory component; functional circuitry 12 may also include or consist of analog circuits, such as drivers, converters and the like. It should be noted, of course, that functional circuitry 12 in each of components 10a through 10n may not necessarily be, and (except perhaps in the case of memory components) will likely not be, identical with one another, even though connected in parallel as shown in FIG. 1.

Lines T0, T1 and T2 of circuit board 1 are connected to corresponding terminals T0, T1 and T2 of each of components 10a through 10n, in parallel as shown in FIG. 1. In addition, power supply terminal $V_{cc}$, providing a positive power supply bias voltage, and reference supply $V_{ss}$, or ground, are also connected in parallel so as to bias each of components 10a through 10n in the conventional manner. Within each component 10, lines T0, T1, and T2, and power supply lines $V_{cc}$ and $V_{ss}$ are connected to functional circuitry 12. Terminals T0, T1, and T2 may serve as inputs to functional circuitry 12, outputs from functional circuitry 12, or combination input/outputs, in the conventional manner, in each case communicating signals to and from functional circuitry 12. It should be noted that, as noted above, the number of terminals for conventional components 10 number much greater than the three shown for clarity in FIG. 1, and can, in modern components, number on the order of one hundred. It should also be noted that components 10 may also include terminals connected to lines other than lines T0, T1 and T2 of FIG. 1, some or all of which may not be connected in parallel with other components 10 in circuit board 1.

Within each of components 10, and associated with each of terminals T0, T1, and T2, are parasitic diodes 16. Parasitic diodes 16 are inherent in the construction of conventional integrated circuits at such locations therein where a diffused junction is connected, either directly or via a metal line or resistive element such as polycrystalline silicon, to an external terminal. In conventional integrated circuits, each terminal is connected to one or more diffused regions, either n-type or p-type, or to one or more of each. Each of the diffused regions, in order for functionality of the circuit to be possible, is located within an oppositely doped region, necessarily forming a diode at the junction. For example, an n-type diffused region is disposed within a p-type well, substrate, or epitaxial layer. Accordingly, a connection to an n-type diffused region is a connection to a cathode of a junction diode between the diffused region and its surrounding well or substrate. It is conventional, so that circuit functionality is possible, to bias the substrate or well in such a manner that the parasitic junction diodes are reverse-biased, precluding leakage from the terminal (or internal node, for that matter) to the well or substrate. Accordingly, for terminals which are connected to n-type diffused regions, the p-type substrate or well is connected to a low voltage, preferably the lowest available voltage such as $V_{ss}$; such connection is generally made by way of a metal line or other contact to the substrate or well formed during fabrication of the device. As a result, diodes 16 shown in FIG. 1 are present in components 10, having their cathodes connected to each of terminals T0, T1 and T2, and their anodes connected in common to $V_{ss}$.

Alternatively, it should also be noted that some integrated circuits include substrate bias pumps, which bias the substrate to a voltage below $V_{ss}$. Such substrate pumps are generally energized during the operation of the device, in order to provide improved transistor performance. In such circuits, during operation, diodes 16 have their anodes biased to this lower, pumped, bias.

Conversely, p-type diffused regions are, for the same reasons, disposed within n-type wells or an n-type substrate or epitaxial layer. In the alternative to diodes 16 shown in FIG. 1, connection of the terminals to p-type diffused regions would form parasitic diodes having their anodes connected to the terminals. For such parasitic diodes, in order to reverse-bias these junction diodes, the n-type layer will be connected to a high voltage, preferably the highest voltage or $V_{cc}$.

It should be noted that the presence of diode 16 between terminals of components 10 and $V_{ss}$ (as shown in FIG. 1), or the presence of a parasitic diode between the terminals and $V_{cc}$, or both, as the case may be, depends upon the particular construction of the integrated circuit components 10, particularly the conductivity type of the diffused region to which such terminals are connected. Therefore, while terminals T0, T1, and T2 in each of components 10 are shown as having diodes 16 connected to $V_{ss}$, it should be noted that both diodes 16 and a diode to $V_{cc}$ may be present for any one terminal; alternatively, only the diode to $V_{cc}$ may be present. For example, if a component 10 is constructed by n-channel metal-oxide semiconductor (MOS) technology, where only n-type diffused regions are present, only diodes 16 will be present in component 10. Even if components 10 are constructed according to complementary MOS (CMOS) technology, where both type diffused regions are present and thus allow both diode types to be available, components 10 may still only have one or the other diodes present, depending upon the particular design and construction thereof. It should be noted that it is possible for each of terminals T0, T1 and T2 to not be connected, directly or indirectly, to any diffused region, and instead be connected only to gates of MOS transistors. Such construction is not preferred in modern integrated circuits due to the susceptibility of such devices to damage from electrostatic discharge events.

According to conventional component-level continuity tests, component 10 is biased in order to detect the presence of diodes 16. This is done by intentionally forward-biasing diode 16, and observing the current conducted between the terminal under test and $V_{cc}$. For example, in testing an individual component 10 (prior to its assembly into circuit board 1), the voltage on line T2 is brought to a level which is below $V_{ss}$ by more than the required threshold voltage (0.7 volts for silicon). If continuity exists, diode 16 will be forward biased in component 10, and conduction from $V_{ss}$ to terminal T2 can be observed, according to the characteristic of diode 16. At the component level, if a break in continuity is present (i.e., the connection within component 10 is not made), diode 16 will not be forward biased and no conduction will occur. Of course, where diodes to $V_{cc}$ are present, similar tests may be done, by biasing terminals T0, T1 and T2 at a voltage at least a diode threshold voltage higher than $V_{cc}$ and similarly measuring the current drawn.

Alternatively, component-level continuity testing may be done by sourcing a current into (or sinking current from) the terminal under test, and measuring the voltage drop between the terminal and the appropriate power supply terminal. For the case of components 10 of FIG. 1, at component level testing, if the measured voltage between terminal T2 and $V_{ss}$ is at or about the forward-biased voltage drop (e.g., 0.7 volts in silicon) of diode 16, continuity is present. If the measured voltage is much higher, for example at the tester limit as would be indicative of an open circuit, a break in continuity within component 10 is thus detected.

Referring again to FIG. 1, connection between circuit board 1 and components 10 is shown schematically by connections 14 between lines T0, T1, T2, $V_{cc}$, and $V_{ss}$ and the corresponding terminals. Connections 14 may be made in any one of many conventional ways, for example by the soldering of pin terminals, leadless terminals, or bond pads on components 10 to circuit board 1. For purposes of explanation, in t he example of FIG. 1, connection 14 is absent between terminal T2 of component 10a and line T2 of circuit board 1.

However, after installation of components 10 as shown in FIG. 1, if board-level continuity testing of circuit board 1 constructed according to the prior art is attempted in the same manner as described above for the component level, most continuity faults cannot be detected. Since terminals T0, T1, and T2, and power supply terminals $V_{cc}$ and $V_{ss}$ are connected in parallel for components 10a through 10n, continuity testing of the diodes 16 within components 10a through 10n according to the method described above can only be done in parallel.

For example, if line T2 is brought to a voltage at or below a threshold voltage below $V_{ss}$, those diodes 16 in components 10 to which successful connection has been made will be forward-biased. However, these diodes 16 for components 10a through 10n, after installation into circuit board 1, are connected in parallel between line T2 and $V_{ss}$. Accordingly, if continuity is present for any of terminals T2 of components 10a through 10n, conduction between line T2 and $V_{ss}$ will be observed. Such conduction would be observed even in the case of FIG. 1, where break 13 (rather than a connection 14) is present between terminal T2 of component 10a and line T2. Only if there were no continuity for any of components 10a through 10n would an open circuit between line T2 and $V_{ss}$ be observed. Similar behavior would be observed in the case where a current is sourced into $V_{ss}$ relative to terminal T2 and the voltage drop therebetween measured; in the example of FIG. 1, the voltage drop would be determined by diodes 16 in components 10b through 10n, and would be not be detectably different from that which would be measured if continuity were present to terminal T2 of component 10a.

Accordingly, after installation of components 10a through 10n in circuit board 1, the only method by which the break 13 would be detected is the functional testing of functional circuitry 12a of component 10a. Lack of connection between line T2 and its corresponding terminal of component 10a would of course result in the inability of functional circuitry 12a to perform its intended function. However, as noted hereinabove, after a detected failure of component 10a from functional test, the manufacturer would not know if the failure were due to faulty connection of component 10a to circuit board 1, due to a failure internal to functional circuitry 12a of component 10a, due to faulty board design, or to any one of numerous other potential failure causes. The inability to directly test continuity in circuit board 1 of FIG. 1 thus inhibits rapid diagnosis of the cause of failure.

It should be noted that, for many VLSI logic circuits, the testing of the logic is by way of application of a series of digital stimuli, or vectors, which are generated during the design of the logic circuit itself; such vectors, as is well known, may not necessarily operate the circuit as in the system, but are selected in order to thoroughly test the greatest number of internal nodes in the fewest possible cycles. When a continuity fault at one of the terminals is present, however, it has been observed that the response of the circuit is unpredictable, and may be dynamically unpredictable. This unpredictability, present at the component level, is compounded by the interaction of other components when tested after installation in the system, such as circuit board 1 of FIG. 1.

Identification of continuity faults by analysis of the response of the circuit to the test vector sequence could be done via fault simulation, but it is believed that such simulation would require considerable development effort.

Figure 2:
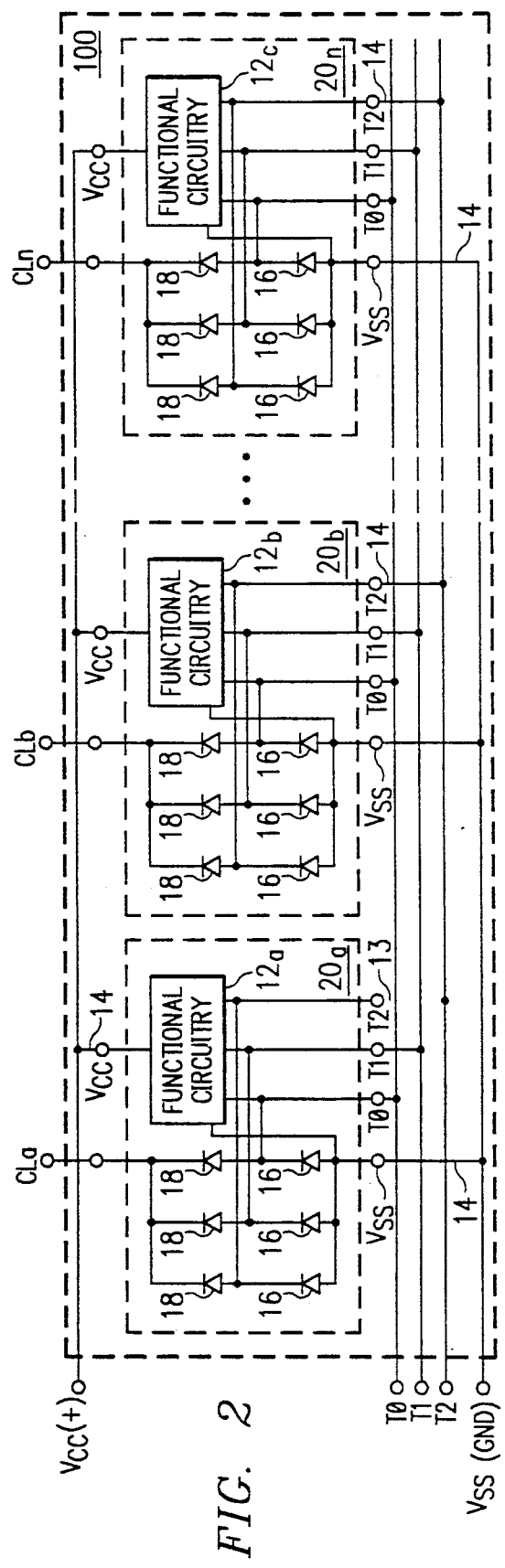
FIG. 2 is an electrical diagram, in schematic form, of a circuit board incorporating the preferred embodiment of the invention.

Referring now to FIG. 2, circuit board 100, containing components 20, constructed according to the preferred embodiment of the invention, will now be described. The same reference numerals are used in circuit board 100 and components 20 of FIG. 2 as for like elements in circuit board 1 and components 10 of FIG. 1. Components 20 are integrated circuit components in packaged form of conventional types known as dual-inline-packages (DIPs), single-inline-packages (SIPs), pin-grid-arrays, or the like, as described above relative to components 10; alternatively, components 20 may be unpackaged semiconductor or other integrated circuits which are bonded directly to circuit board 100, for example by way of solder bumps or the like.

Each of components 20, in addition to functional circuitry 12, terminals T0, T1, T2, $V_{cc}$ and $V_{ss}$, and diodes 16, as present in components 10, also include diodes 18. Each diode 18 has its anode connected to a terminal T0, T1, or T2, as the case may be, and has its cathode connected to a terminal CL of component 10. It should be noted that terminals $CL_a$, $CL_b$ and $CL_n$ are not connected in parallel with one another in circuit board 100 according to this embodiment of the invention; accordingly, it is preferable that terminals CL have no functional purpose relative to functional circuitry 12 in components 20, and therefore be electrically isolated from functional circuitry 12 (thus providing no reason for their connection in parallel on circuit board 100). Such parallel connection of terminals $CL_a$ through $CL_n$ would limit their benefit of providing independent continuity testability for components 20.

Diodes 18 are preferably constructed within the integrated circuits which make up components 20, i.e., on the same semiconductor chip as functional circuitry 12 and diodes 16, according to any one of the conventional techniques known in the art. Examples of such diodes include junction diodes as discussed above, where the anode of diode 18 is in a p-type diffused region disposed within an n-type well or layer, serving as the cathode; conversely, of course, the cathode of diode 18 could be an n-type diffused region within a p-type well. Other alternative examples include thin-film diodes such as may be formed in polycrystalline silicon, Schottky barrier diodes formed by a metal layer in contact with a semiconductor region, and other diode types as are well known in the art. It should be noted, however, that the common node (e.g., the cathodes of diodes 18 in FIG. 2) should be electrically isolated from the power supply terminals $V_{ss}$ and $V_{cc}$ within component 20, so that the ability to independently test the continuity of each of components 20 is maintained.

Alternatively, diodes 18 may be provided as discrete diodes, i.e., not integrated into the same integrated circuit of components 20 having functional circuitry 12 and diodes 16. Such discrete diodes, according to this alternative embodiment of the invention, would be located within the package of components 20, and bonded in parallel between the package terminals T0, T1, T2 and the package terminal CL, according to conventional hybrid integrated circuit packaging techniques. Such construction of discrete diodes 18 necessarily requires additional connections within the package, and accordingly requires a more complex packaging process and presents more opportunities for continuity faults to occur. However, the continuity of connections within packaged components may easily be tested at the component level, as described hereinabove. Accordingly the board-level continuity testing, and its benefits, described herein would also be achieved by such construction of diodes 18 as discrete elements.

It should also be noted that the orientation of diodes 18 of FIG. 2 may, alternatively, be reversed from that shown in FIG. 2. In such an alternative orientation, of course, the anodes of diodes 18 would be connected in common to terminal CL, and the cathodes individually connected to the individual terminals T0, T1, and T2. The choice of orientation of diodes 18 may depend upon such factors as compatibility with the manufacturing process used to fabricate the integrated circuits of components 20, and on the convenience of biasing terminals CL after manufacture, as will be described hereinbelow.

Testing of the continuity of components 20 after installation in circuit board 100 may be performed individually due to the construction of components 20, according to this embodiment of the invention, including diodes 18 and dedicated terminals CL; an example of such testing will now be described. To test the continuity of component 20a, for example, lines T0, T1, and T2 of circuit board 20 are biased to a voltage higher than line $CL_a$ by an amount at or exceeding the diode threshold voltage of diode 18 (e.g., 0.7 volts in silicon). To isolate components 20b through 20n, lines $CL_b$ through $CL_n$ are held to a voltage higher than that of lines T0, T1 and T2 during this portion of the test. Furthermore, to isolate diodes 16, line $V_{ss}$ is preferably biased to a voltage lower than that of terminals T0, T1 and T2.

The current is then measured for each of lines T0, T1 and T2; for those of lines T0, T1 and T2 at which conduction is observed, continuity to the respective terminals exists. If, as in the case shown in FIG. 2, a continuity break 13 is present between line T2 and terminal T2 of component 20a, an open circuit condition between line T2 and line $CL_a$ will be observed, and the break will be detected. The presence of diodes 18 between terminals T2 and terminals CL for the other components 20b through 20n in circuit board 100 does not interfere with the detection of this break 13, as lines $CL_b$ through $CL_n$ are held at a voltage so that diodes 18 are reverse-biased for components 20b through 20n.

As described above, alternatively a current may be forced onto line T2, with lines $CL_b$ through $CL_n$ floating, and the voltage between line T2 and line $CL_a$ measured If continuity to terminal T2 of component 20a is present, the forward-biased voltage drop of diode 18 will be measured. In the case of FIG. 2, where break 13 is present at terminal T2 of component 20a, a much higher voltage indicative of an open circuit will be measured, such a voltage dependent upon the tester characteristics and the current and voltage limitations for the test. Lines $CL_b$ through $CL_n$ would float in such a test, isolating diodes 18 associated with terminals T2 of components 20b through 20n so as not to affect the test of component 20a.

It should be noted that the continuity of terminals T0, T1 and T2 may be tested simultaneously, as noted above, so long as the conduction can be independently monitored for each of lines T0, T1, and T2. Alternatively, continuity for terminals T0, T1 and T2 may be individually tested in sequence, if preferred. It should also be noted that a leakage test may also be performed, either prior to or after the continuity test described hereinabove, in which all of lines CL are held to a voltage higher than lines T0, T1, and T2 and the current is measured. Such a test will ensure against false readings of continuity, where conduction from lines T0, T1 or T2 to power supply lines occurs due to a short in circuit board 20a, leakage within a component 20, or another similar mechanism.

As a result of the construction of components 20 and circuit board 100 according to this embodiment of the invention, a continuity failure, such as results from break 13 in FIG. 2, can be detected from a simple continuity test. The detection of the continuity failure, separately and distinctly from functional failure, allows for rapid troubleshooting and rework of circuit boards 100 having such problems thereon. In addition, since each component 20 is individually tested, and since each terminal of each component 20 is individually tested, the location of any observed continuity break can be easily pinpointed, further facilitating repair of the faulty connection.

After successful testing of circuit board 100 is complete, diodes 18 are preferably reverse-biased so that they do not present leakage paths during the normal operation of circuit board 100. In the embodiment illustrated in FIG. 2, this may be accomplished by connecting lines $CL_a$ through $CL_n$ to the power supply line $V_{cc}$. With the logic level swings on terminals $CL_a$ through $CL_n$ staying at a voltage below a threshold voltage greater than $V_{cc}$, diodes 18 will remain reverse-biased. Connection of lines $CL_a$ through $CL_n$ may easily be done by way of simple jumpers on circuit board 100, or by connectors used to interface circuit board 100 to the remainder of the computer or other system into which circuit board 100 is installed. Alternatively, one of any number of electronic switching devices (e.g., a transistor) may be used to connect lines $CL_a$ through $CL_n$ to the power supply line $V_{cc}$.

It should be noted that the provision of diodes 18, in the embodiment of FIG. 2, also provides additional benefits to that of the improved continuity testability. With diodes 18 reverse-biased to $V_{cc}$, as described hereinabove, diodes 18 will serve as clamping diodes for lines T0, T1 and T2. Accordingly, the voltage on lines T0, T1 and T2 is clamped by diodes 18 to a voltage which is no greater than a forward-biased diode voltage drop (e.g., 0.7 volts for silicon) above $V_{cc}$. This is beneficial in the operation of circuit board 100, as the total signal swings, including noise, on lines T0, T1 and T2 will be controlled, allowing for faster and less noisy operation.

It should be noted that the above-described embodiment of the invention requires an additional terminal CL to be provided for each of components 20, whether in packaged form or in chip form. As noted above, the problem of continuity testing is especially difficult for components, such as large gate arrays, microprocessors and the like, which have a large number of package terminals. While it is generally beneficial to have a few terminals as possible for integrated circuits on a board, the components noted hereinabove are currently fabricated with a large number of terminals on the package, many of which are "no connects". Accordingly, the impact of implementing the instant invention is expected to be negligible, if any.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. A system, comprising:
 a circuit board;
 a signal line disposed on said circuit board for conducting electrical signals;
 a bias line disposed on said circuit board for conducting a bias voltage;
 first and second test lines disposed on said circuit board for conducting test signals;
 a first component disposed on said circuit board, comprising:
  a signal terminal connected to said signal line;
  a bias terminal connected to said bias line;
  a test terminal connected to said first test line; and
  a test diode connected between said signal terminal and said test terminal; and
 a second component disposed on said circuit board, comprising:
  a signal terminal connected to said signal line;
  a bias terminal connected to said bias line;
  a test terminal connected to said second test line; and
  a test diode connected between said signal terminal and said test terminal;
 wherein said second component is not connected to said first test line;
 wherein, during testing of said system, said first and second test lines are electrically isolated from one another;
 and wherein, during operation of said system, said first and second test lines are connected to said bias line.

2. The system of claim 1, wherein said first and second components each further comprise:
 functional circuitry coupled to said signal terminal and said bias terminal, for performing a function in communication with said signal terminal, biased by a voltage on said bias line.

3. The system of claim 2, wherein said functional circuitry is electrically isolated from said test terminal in each of said first and second components.

4. The system of claim 1, wherein said first component further comprises:
 functional circuitry coupled to said signal terminal and said bias terminal, for performing a function in communication with said signal terminal, biased by the voltage on said bias line; and
 a package within which said functional circuitry and said test diode are disposed;
 wherein said bias terminal, said signal terminal, and said test terminal extend from said package.

5. A system, comprising:
 a circuit board;
 a signal line disposed on said circuit board for conducting electrical signals;
 a bias line disposed on said circuit board for conducting a bias voltage;
 a test line disposed on said circuit board for conducting test signals;

a first component disposed on said circuit board, comprising:
- a signal terminal connected to said signal line;
- a bias terminal connected to said bias line;
- a test terminal connected to said test line;
- a test diode connected between said signal terminal and said test terminal;
- functional circuitry coupled to said signal terminal and said bias terminal, for performing a function in communication with said signal terminal, biased by the voltage on said bias line;
- a package within which said functional circuitry and said test diode are disposed in such a manner that said bias terminal, said signal terminal, and said test terminal extend from said package; and
- a parasitic diode connected between said signal terminal and said bias terminal, said parasitic diode and said functional circuitry disposed on the same integrated circuit; and a second component disposed on said circuit board, comprising:
- a signal terminal connected to said signal line; and
- a bias terminal connected to said bias line;

wherein said second component is not connected to said test line.

6. The system of claim 5, wherein said test diode, said parasitic diode, and said functional circuitry are disposed on the same integrated circuit.

7. A method of testing a circuit board for continuity of connection to a first component mounted thereupon, said circuit board having first and second components mounted thereupon, each having a bias terminal and a signal terminal, said first component also having a first diode connected between said signal terminal and a test terminal, comprising:
- generating an electrical signal on a first test line, corresponding to said test terminal of said first component, relative to a signal line, corresponding to said signal terminals of said first and second components, in such a manner that said first diode of said first component is forward biased if continuity of connection is present;
- measuring the impedance between said first test line and said signal line to observe if continuity of connection is present; and
- after said step of measuring the impedance between said first test line and said signal line, connecting said first test line to said bias line.

8. The method of claim 7, wherein said second component also has a first diode connected between said signal terminal and a test terminal;
- and further comprising biasing, during said measuring step, a second test line corresponding to said test terminal of said second component, relative to said signal line in such a manner that said first diode of said second component is reverse biased if continuity of connection is present between said second component and said circuit board.

9. The method of claim 8, further comprising:
- generating an electrical signal on said test line relative to said signal line in such a manner that said first diode of said second component is forward biased if continuity of connection is present;
- biasing said first test line relative to said signal line in such a manner that said first diode of said first component is reverse biased if continuity of connection is present between said first component and said circuit board; and
- during said step of biasing said first test line, measuring the impedance between said second test line and said signal line to observe if continuity of connection is present.

10. The method of claim 7, wherein said first component also has a second diode between said signal terminal and said bias terminal;
- and further comprising, during said measuring step, biasing a bias line, corresponding to said bias terminal, relative to said signal line in such a manner that said second diode is reverse biased if continuity of connection is present between said first component and said circuit board.

11. A method of testing a circuit board for continuity of connection to a first component mounted thereupon, said first component having a bias terminal, a signal terminal, functional circuitry, a test terminal electrically isolated from said functional circuitry, and a first diode connected between said signal terminal and said test terminal, comprising:
- generating an electrical signal on a first test line, corresponding to said test terminal of said first component, relative to a signal line, corresponding to said signal terminal of said first component, in such a manner that said first diode of said first component is forward biased if continuity of connection is present;
- measuring the impedance between said first test line and said signal line to observe if continuity of connection is present; and
- after said step of measuring the impedance between said first test line and said signal line, connecting said first test line to said bias line.

12. The method of claim 11, wherein said circuit board also has a second component mounted thereupon, said second component having a bias terminal, a signal terminal, and functional circuitry;
- and wherein said signal line also corresponds to said signal terminal of said second component.

13. The method of claim 12, wherein said second component also has a first diode connected between said signal terminal and a test terminal;
- and further comprising biasing, during said measuring step, a second test line corresponding to said test terminal of said second component, relative to said signal line in such a manner that said first diode of said second component is reverse biased if continuity of connection is present between said second component and said circuit board.

14. The method of claim 11, wherein said first component also has a second diode between said signal terminal and said bias terminal;
- and further comprising, during said measuring step, biasing a bias line, corresponding to said bias terminal, relative to said signal line in such a manner that said second diode is reverse biased if continuity of connection is present between said first component and said circuit board.

* * * * *